(12) United States Patent
Armstrong et al.

(10) Patent No.: US 7,902,262 B2
(45) Date of Patent: Mar. 8, 2011

(54) METHOD OF RECYCLING MIXED STREAMS OF EWASTE (WEEE)

(75) Inventors: William Terence Armstrong, Doncaster (AU); Stephen Michael Morriss, Eltham South (AU); Glen Wilkie, Blackburn North (AU); John Scheirs, Edithvale (AU)

(73) Assignee: Close the Loop Technologies Pty Ltd., Victoria (AU)

( * ) Notice: Subject to any disclaimer, the term of this patent is extended or adjusted under 35 U.S.C. 154(b) by 1310 days.

(21) Appl. No.: 10/548,771

(22) PCT Filed: Jun. 15, 2005

(86) PCT No.: PCT/AU2005/000849
§ 371 (c)(1),
(2), (4) Date: Sep. 9, 2005

(87) PCT Pub. No.: WO2005/123817
PCT Pub. Date: Dec. 29, 2005

(65) Prior Publication Data
US 2007/0054106 A1 Mar. 8, 2007

(30) Foreign Application Priority Data
Jun. 15, 2004 (AU) ................................ 2004903217

(51) Int. Cl.
*C08J 11/04* (2006.01)
(52) U.S. Cl. ............... 521/40; 521/40.5; 521/47; 521/49
(58) Field of Classification Search .................... 521/40, 521/40.5, 47, 49
See application file for complete search history.

(56) References Cited

U.S. PATENT DOCUMENTS

| | | | |
|---|---|---|---|
| 5,298,214 A | 3/1994 | Morrow et al. | |
| 5,772,041 A | 6/1998 | Kertscher et al. | |
| 6,007,005 A | 12/1999 | Gonzales et al. | |
| 6,342,539 B1 | 1/2002 | Chapman | |
| 2003/0199596 A1* | 10/2003 | Koike et al. | 521/40 |

FOREIGN PATENT DOCUMENTS

| | | |
|---|---|---|
| DE | 4323217 | 8/1994 |
| EP | 1226913 | 7/2002 |
| JP | 11151719 | 6/1999 |

OTHER PUBLICATIONS

International Search Report for PCT/AU2005/000849 mailed Aug. 4, 2005.
Steve Morriss and John Scheirs; "New Inventors: eWood" www.abc.net.au. © 2006 ABC; printed Jul. 16, 2008; 4 Pages.

* cited by examiner

*Primary Examiner* — Edward J Cain
(74) *Attorney, Agent, or Firm* — King & Schickli, PLLC (57) ABSTRACT

The present invention relates to the recycling of waste electrical and electronic equipment (WEEE). Preferably, the present invention relates to the substantial recycling of all material forming the WEEE, thus providing substantially zero landfill. In yet another form, the invention relates to an additive and/or method of providing an additive. In still another form, the invention relates to recycling ink, toner, and/or PU foam from imaging consumables, forming part of the WEEE. In another form, the invention relates to the recycling of plastic materials containing flame retardants, including the recycling of plastics materials, such as plastics materials containing brominated flame retardants generally based on styrenics (e.g. PS, HIPS, ABS, PPO/PS, PPE/PS, ABS/PC) and polyamides (Nylon 6, nylon 6,6, nylon 12) and other engineering plastics such as polyacetal, polycarbonate, PET, PBT, liquid crystal polymers.

13 Claims, 4 Drawing Sheets

METHOD OF RECYCLING MIXED STREAMS OF EWASTE (WEEE)

FIELD OF INVENTION

The present invention relates to the field of recycling materials, such as plastics materials.

In one form, the present invention relates to the recycling of waste electrical and electronic equipment (WEEE). Preferably, the present invention relates to the substantial recycling of all material forming the WEEE, thus providing substantially zero landfill and/or zero incineration.

In another form, the invention relates to the recycling of plastic materials containing flame retardants.

In yet another form, the invention relates to an additive and/or method of providing an additive.

In still another form, the invention relates to recycling ink, toner, and/or PU foam from imaging consumables, forming part of the WEEE.

It will be convenient to hereinafter describe the invention in relation to the recycling of waste electrical and electronic equipment (WEEE), including those plastic materials containing flame retardants, however it should be appreciated that the present invention is not limited to that use only.

BACKGROUND ART

The use of flame retardants in certain electrical and electronic (E&E) plastic components is essential to ensure safety and compliance with relevant safety regulations. On average 30-50% of plastics used in E&E equipment contain halogenated flame retardants. Brominated Flame Retardants are typically preferred because it requires the lowest quantity of flame retardant for the highest fire safety. The recycling of plastics containing brominated flame retardants is technically challenging however.

The present inventors have realised that Brominated Flame Retardants contain 50-95%-wt of bromine, and can be separated into aromatic, aliphatic and cyclo-aliphatic. There are over 40 different BFR types in commercial use but only a handful of those are widely used. The aromatic Brominated Flame Retardants can be divided into three types, i.e. polybrominated diphenyl ethers (PBDEs), tetrabromo bisphenol A (TBBPA) and its derivates, and polybrominated biphenyls (PBBs). Of the cycloaliphatic Brominated Flame Retardants compounds, hexabromocyclododecane (HBCD) is the most important. Aliphatic Brominated Flame Retardants are not used in large amounts since they are less stable than aromatic Brominated Flame Retardants; they may be more effective at lower temperatures, however.

The present inventors have realised that the most widely used Brominated Flame Retardant compound nowadays is tetrabromobisphenol A, TBBPA. TBBPAs and their derivatives include TBBPA bis-(2-hydroxyethylether). Their market share is the largest one of flame retardants market world wide. TBBPA and its derivatives main use are as additive Flame Retardants for polybutylene terepthalate (PBT), polyethylene terephtalatete (PET) and ABS plastics.

The present inventors have realised that the second important type of Brominated Flame Retardants are polybrominated diphenyl ethers, PBDEs such as deca-BDE, octa-BDE and penta-BDE from which the deca-BDE is considered one of the most common compounds. Major uses for PBDEs are plastic housings of smaller office equipment and in polyolefin plastics. There has been much recent discussion concerning Bromines PBDEs toxicological effects and there have also been recent regulation changes, for example in Europe.

Decabromodiphenyl ether (DBDE) continues to be widely used as a flame retardant for plastics, particularly high impact polystyrene (HIPS). The present inventors have realised that there is a perception that these brominated flame retardants (BFR) form brominated dioxins and furans during reprocessing which are considered dangerous from an occupational health and safety perspective. For electronic plastic parts, such as those from end-of-life printers and computers, bromine extraction and relative neutralization is required to provide an economically viable solution to the brominated flame retardant problem. Yet this problem remains hereto before unsolved.

The present inventors have also realised that attitudes and regulations regarding environmental issues and recycling of plastics vary considerably around the world. While recycling in the U.S. is generally voluntary and economically driven, Europe and Asia generally have regulation governing plastics recycling. There is also a trend in Europe and Asia towards increasing the responsibility of the products producer for the end-of-life outcome of their products. Regulations are expected to drive innovation and create markets for recycled material.

The inventors have realised that the waste electrical and electronic equipment (WEEE) directive, recently set-up in Europe is pushing the need to safely and effective recycling of plastics, including those containing brominated flame retardants. This will set new requirements for the treatment of the waste products. These requirements include higher recyclability of the products material content as well as separate treatment of certain parts. Mobile phones for example contain up to 70% plastics, which are lost in the mechanical and thermal process, where only metals are collected.

The inventors have also realised that the main fractions of scrap from end-of-life electronic and electrical appliances are metals, glass and plastics. The first two of these can be relatively easily separated and reclaimed with existing technology. However, a significantly higher plastic content in future generations of appliances will dramatically alter the recycling equation, thereby forcing the sector to step up its efforts to devise improved ways of recycling WEEE.

Environmental, financial and legislative drivers are also pushing towards more rigorous approach to recycling. Currently recycling technologies are optimised for precious and ferrous metal recycling. These technologies are considered not suitable for recycling of products that are mostly of other materials such as plastics. Current technologies are also not directed at providing zero landfill. Thus there is a need to process the WEEE materials considered to be 'waste' in various other industries.

The inventors have further realised that there are four types of plastics which dominate the polymeric materials found in WEEE, namely acrylonitrile butadiene styrene (ABS), high-impact polystyrene (HIPS), polycarbonate (PC) and an ABS/polycarbonate (ABS/PC) blend. There are also many different polymer types of materials in WEEE, for example, with some WEEE streams some 35 types of polymer materials have been identified. Plastic sorting and separation is required to maximize economic return. Plastic enrichment and purification to a level to enable marketability is therefore required.

U.S. Pat. No. 6,335,376 describes an apparatus and method for enhancing partitioning of different polymeric materials from a mixture by density differential alteration. Float-sink baths are employed but the materials are foamed in order to affect separation.

U.S. Pat. Nos. 6,080,473 and 6,007,005 both disclose a process for manufacturing extruded ABS products includes recycling used ABS to produce a recycled ABS exhibiting predetermined characteristics and extruding the recycled ABS to produce an ABS product. The process incorporates a salt bath for float-sink separation.

A froth-flotation process for the separation and recovery of high-purity ABS from mixed plastics is disclosed in U.S. Pat. No. 5,653,867, Method for Separation of High Impact Polystyrene and Acrilonitrile Butadiene Styrene Plastics). This process uses a binary acid/salt bath to separated ABS from HIPS.

There is still a need for foreign materials (particularly metals) to be satisfactorily processed as the foreign materials downgrade the performance of recovered plastics. Plastic separation is also necessary to achieve consistent properties and upgrade performance. For example, toner cartridges by their multicomponent nature are considered challenging to recycle by reprocessing. The plastic stream recovered by direct shredding of toner cartridges contains well-adhered foreign materials, electrostatically-bound toner dust and significant levels and sizes of both ferrous and non-ferrous (principally aluminium) metals. It is therefore known to be difficult to recycle waste from WEEE because of the many different polymer types.

The inventors have also realised that materials found in WEEE are an intimate mixture of plastic, metals, foam, rubber, toner, ink, ceramics/glass, and intractables, such as additives, glue, epoxy, silicon and many other materials and elements not falling into the previous groups. Thus, one problem in the recycling of WEEE is how to deal with this complex mix of many elements. The recovery of most non-ferrous and ferrous metals and some pure streams of plastics are known. However, there still exists a difficulty in the recycling of relatively heavily contaminated and mixed streams of elements, especially those that do not readily form pure streams. To date, most of this heavily contaminated and mixed stream of elements is sent to landfill or incineration, neither of which is desirable nor sustainable. There is thus a need to provide for the recycling and/or reuse of material forming WEEE, without landfill or incineration.

The inventors have additionally realised that there are also a number of hazardous substances within WEEE which are contained within the plastic components of the WEEE, in particular brominated flame retardants (BFR) which may be a barrier to recycling. For example, housings or enclosures for computer monitors and printers are predominantly made from high-impact polystyrene (HIPS), ABS-polycarbonate blends or ABS-based flame retardant compounds, although polypropylene (PP), polycarbonate (PC) and blends of polyphenylene ether (PPE) and styrene/butadiene polymer may be used as well. In the 1990s, HIPS represented 30% of the global De-BDE consumption, and ABS accounted for around 95% of the total Oc-BDE supplied in the EU.

The present inventors have realised that mechanical recycling is a potentially effective option for large electronic parts which typically have high levels of flame retardants. However concerns over halogenated flame retardants and in particular brominated flame retardants have been ongoing. Two specific brominated flame retardants, pentabromodiphenyl oxide and octobromodiphenyloxide, are being considered for a ban in Europe.

While these plastics can be mechanical recycled and reprocessed, a major concern is the formation of brominated dioxins and furans as well as HBr, Br2 and non aliphatic compounds emissions are also hazardous.

Brominated flame retardants pose some technical problems in reprocessing (toxic fume emissions etc), melt porosity and polymer property deterioration. The production of toxic fumes during re-extrusion of brominated flame retardant plastics from waste electrical and electronic equipment is another barrier preventing the more widespread recycling of the plastics components of WEEE, such as computer housings, printers and television housings.

Still further, the inventors have realised that the reprocessing of plastics containing brominated flame retardants can lead to the formation of polybrominated diphenyl dioxins and polybrominated diphenyl furans (PBDD/F). These are highly regulated compounds and reports are that the conventional melt reprocessing of mixed plastics containing brominated flame retardants can lead to PBDD/F concentrations exceeding the regulation limits.

Any discussion of documents, devices, acts or knowledge in this specification is included to explain the context of the invention. It should not be taken as an admission that any of the material forms a part of the prior art base or the common general knowledge in the relevant art in Australia or elsewhere on or before the priority date of the disclosure and claims herein.

An object of the present invention is to provide an improved process of enabling the recycling of mixed plastics containing Brominated Flame Retardants.

A further object of the present invention is to alleviate at least one disadvantage associated with the prior art.

SUMMARY OF INVENTION

The present invention provides, in a first aspect of invention, an input composition for a plastics material, comprising at least foam, toner, ink or any one of the above.

The present invention provides, in a second aspect of invention, a method of recycling WEEE and/or a resultant composition and/or product produced by the method, comprising the steps of providing a dry processing stream adapted to process dry WEEE, to provide a first output material stream, providing a wet processing stream adapted to process wet WEEE, to provide a second output material stream, and mixing a portion of the first output stream and the second output stream to provide a third output stream.

The present invention provides, in a third aspect of invention, a composite plastics material as disclosed herein and/or made in accordance a method as disclosed herein.

The present invention provides, in a fourth aspect of invention, a method of recycling WEEE, and/or resultant composition and/or product produced by the method, comprising providing WEEE input material, refining the input material and producing an output material stream, the output stream being substantially a number of constituent materials, manufacturing a plastic composite material from at least a portion of the output material stream.

The present invention provides, in a fifth aspect of invention, a method of separating substantially plastics materials originating from WEEE, the method comprising the steps of processing the WEEE to a nominal size range thus providing a first batch material, immersing the first batch material in a first liquid, resulting in substantial separation of a first material and a residual second batch material, and subsequently immersing the second batch material in a second liquid, resulting in substantial separation of a second material and a residual third batch material.

The present invention provides, in a sixth aspect of invention, a method of processing plastic material containing at least Brominated Flame Retardants (BFR), the method including the steps of heating the plastic material to a selected temperature, enabling the BFR to at least partially decompose to gaseous hydrobromic acid (HBr), and extracting at least a portion of the HBr from the heated plastic material.

The present invention provides, in a seventh aspect of invention, a vented barrel adapted to provide a low pressure zone within a plastics material processing apparatus, the barrel including means for moving plastics material through the barrel, at least one vent through which fluid may be extracted, and means for providing a low pressure zone.

The present invention provides, in an eighth aspect of invention, an apparatus adapted to process plastic material containing at least Brominated Flame Retardants (BFR), the apparatus including means for heating the plastic material to a selected temperature, and a vented barrel as disclosed herein, and vacuum means adapted to extract fluid from the heated plastic material.

The present invention provides, in a ninth of invention, a method for debrominating polymeric materials containing volatile components such as hydrobromic acid using an extruder with a vented barrel to enable devolatilization of the polymer melt.

The present invention provides, in a tenth aspect, a method and/or apparatus for the recycling of relatively heavily mixed and contaminated non-homogeneous plastic residue left over from the recycling of WEEE. In this aspect, the 'waste' output streams are bound into a composite plastic based lumber or other product instead of being placed in landfill.

Other aspects and preferred aspects are disclosed in the specification and/or defined in the appended claims, forming a part of the description of the invention.

In essence, the present invention deals with both issues of recycling commingled plastic mixes and evolution of acidic and toxic bromine compounds during recycling by the use of a specially vented melt reprocessing process. In one form, the equipment uses high vacuum in the melt phase to draw off Brominated Flame Retardants fumes and these are then scrubbed in a water scrubber to produce innocuous bromide salts. The invention, in one aspect, relies on a vented barrel (i.e. one fitted with vent ports) to permit vacuum devolatilization without foaming of the melt extrudate and without liberation of potentially toxic fumes into the workplace.

Advantageously, the salts may be concentrated by evaporation to produce compounds for use in density baths for plastics separation. The plastic melt can in this way be debrominated rendering the process and resultant plastic relatively safe.

The commingled plastic melt stream may then be compression moulded and/or otherwise formed to produce useful retaining wall bricks with large cross-sectional area and desirable textured surfaces. Additionally the mix of engineering plastic (e.g. ABS, HIPS) to commodity plastic (e.g. PP, PE) can be varied to produce specific end properties. Other products may also be manufactured from the commingled plastic melt stream of the process of the present invention.

The present invention has been found to result in a number of advantages, such as:
- the ability to deal with end-of-life mixed plastic products such as computer housings, printers, toner and ink cartridges, etc in a relatively environmentally safe and effective manner,
- the ability to process waste electrical and electronic plastics, such as HIPS, flame retarded with brominated flame retardants, such as DecaBDE, and ABS flame retarded with TBBPA (tetrabromobisphenol A) which traditionally have been difficult to mechanically recycle,
- a relatively safe and effective conversion of plastics containing brominated flame retardants into useful moulded plastics products,
- applying a vacuum to the polymer melt through at least one vent port in the extruder to remove volatile components in the composition, such as brominated dioxins and furans as well as Hbr, Br2, and non-aliphatic compound emissions,
- the relatively safe and effective conversion of plastics containing brominated flame retardants into useful moulded plastic products, and
- extraction of volatiles from the decomposition of brominated flame retardants thus preventing safety issues, porosity of the plastic extrudate and the deterioration of performance properties of the recycled plastics.
- the ability to recycle and/or reuse substantially all WEEE
- the ability to recycle and/or reuse at least four types of plastics which have been found to dominate the polymeric materials found in WEEE, namely acrylonitrile butadiene styrene (ABS), high-impact polystyrene (HIPS), polycarbonate (PC) and an ABS/polycarbonate (ABS/PC) blend.
- the ability to recycle and/or reuse substantially all other material found in WEEE by producing a commingled product, such a eWood, or other products which comprise plastics and other materials.
- The ability to recycle what has previously not been recycled, namely toner powder, ink, ink sludge and PU foam.

Throughout this specification, WEEE refers to waste electrical and electronic equipment, including, without limitation, electrical equipment, electronic equipment, consumables and parts for that equipment, ink cartridges and toner cartridges.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Further disclosure, objects, advantages and aspects of the present application may be better understood by those skilled in the relevant art by reference to the following description of preferred embodiments taken in conjunction with the accompanying drawings, which are given by way of illustration only, and thus are not limitative of the present invention, and in which.

DETAILED DESCRIPTION

One aspect of the present invention is directed to the overall processing of WEEE in a manner that substantially no material is required to be disposed of in landfill. In accordance with this aspect, the WEEE material is processed, for example by reducing the material to flakes, then the flaked material is passed through a number of separation stations. In one station, metal is substantially removed, in another, glass is substantially removed.

An additive material (which we refer to as masterbatch) is created in one aspect of invention, using some of the elements of the WEEE which are separated out in the wet process and the dry process. The additive material is, in one form, a colour concentrate. The additive material may be sold as an additive to be included in products made from recycled or other materials. The additive material is preferably combined with other plastics and material obtained from the WEEE to be recycled and serves to bind otherwise incompatible plastics, such as the other mixed and contaminated plastics and material from WEEE, into a strong composite is used to form a melt stream which is then profile extruded to produce useful materials, such as plastics based lumber. The additive material has been found to also add UV stability and relatively consistent colouration to the lumber. The lumber may be relatively large in cross sectional area and may have textured surfaces, if required.

In other aspects of invention, there is a method of debrominating polymeric materials containing relatively violate components such as hydrobromic acid. In a preferred embodiment, the method uses an extruder with a vented barrel to enable devolitisation of the polymer melt. The vented barrel permits devolitisation by venting (vacuum) at ports along the barrel. Preferably this venting is done whilst avoiding foaming of the melt extrudate and avoiding liberation of toxic fumes into the workplace.

The present invention deals with recycling commingled plastics mixes and evolution of acidic and toxic bromine compounds during recycling by the use of a specially vented melt reprocessing process, as will be described in more detail hereinafter.

An extruder having one of more vent ports along it's barrel is provided in one embodiment, referred to as a vented extruder. The vented ports are connected to a vacuum pump. A vacuum of at least 1 mbar has been found to exhaust (most) of the gases from the extruder. The working fluid in the vacuum pump (such as water) may be dosed with alkali (such as sodium hydroxide) to neutralise the acidic bromine compounds extracted from the vented extruder.

The present invention uses relatively high vacuum in the melt phase to draw off brominated FR fumes and these fumes are then scrubbed in a water scrubber to produce innocuous bromide salts. The resultant plastic melt can then be relatively debrominated rendering the process and resultant plastic relatively safe.

In a further aspect, these salts may be concentrated by evaporation to produce compounds adapted to be used in a density bath for separation of plastics materials.

Figure 1:
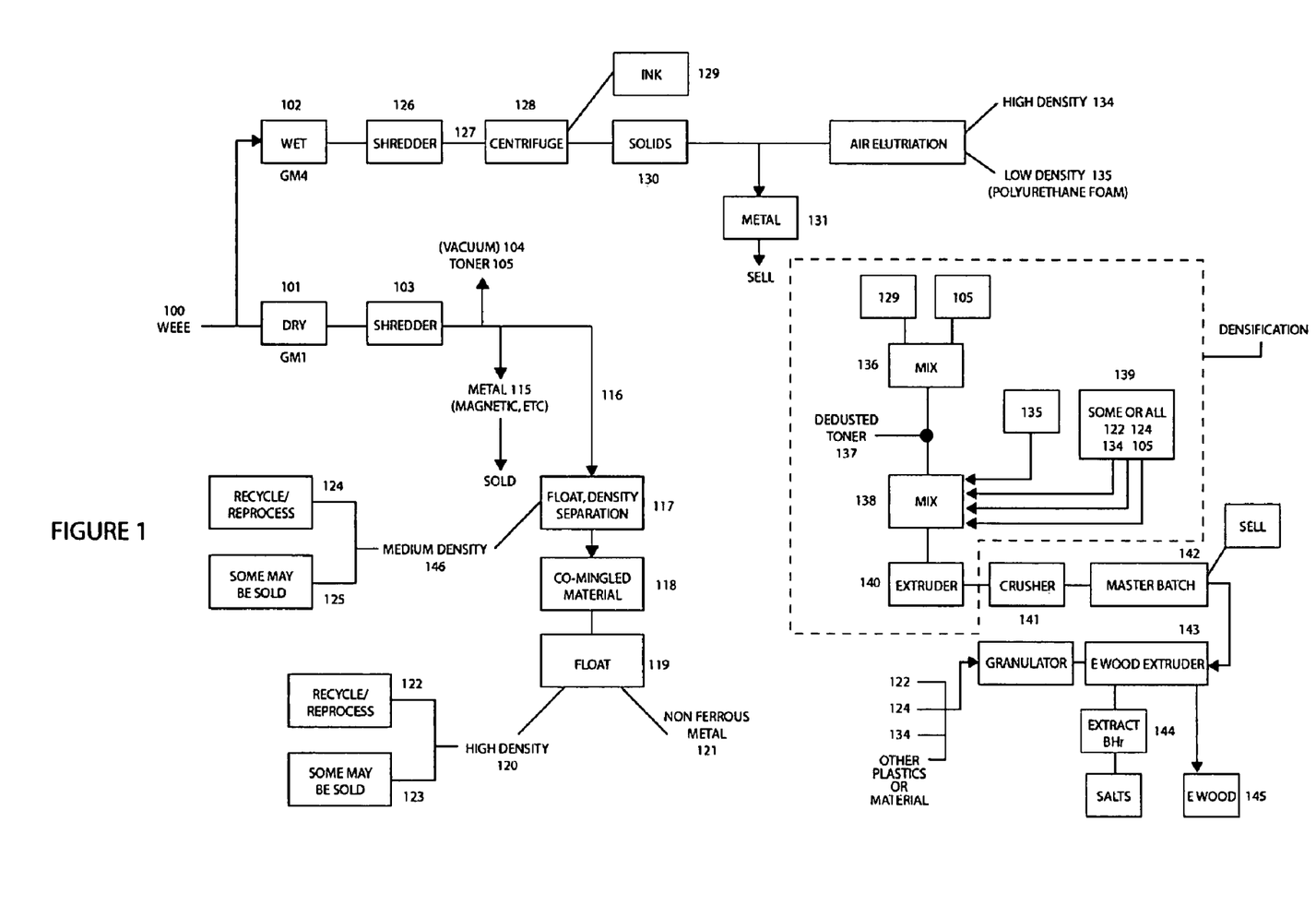
FIG. 1 illustrates an overall schematic diagram of one embodiment of the present invention

In more detail, and referring to FIG. 1, the present invention contemplates the substantial recycling of WEEE. The WEEE 100 stream of material has a wet process 102 and a dry process 101, depending on the nature of the WEEE material. For example, for WEEE 100 which contains liquid inks, the 'wet' process 102 can be used. For WEEE 100 which does not contain liquids, the 'dry' process 101 can be used.

The WEEE stream which forms the 'dry' process may contain, for example, printers, toner cartridges, photocopiers, digital cameras, televisions, computers, computer monitors, mobile phones, and such like equipment or components of such equipment. In the dry process 101, the WEEE stream is first shredded 103 in order to reduce the size of the input to the stream and to facilitate the further separation of the materials into their component parts.

Figure 2:
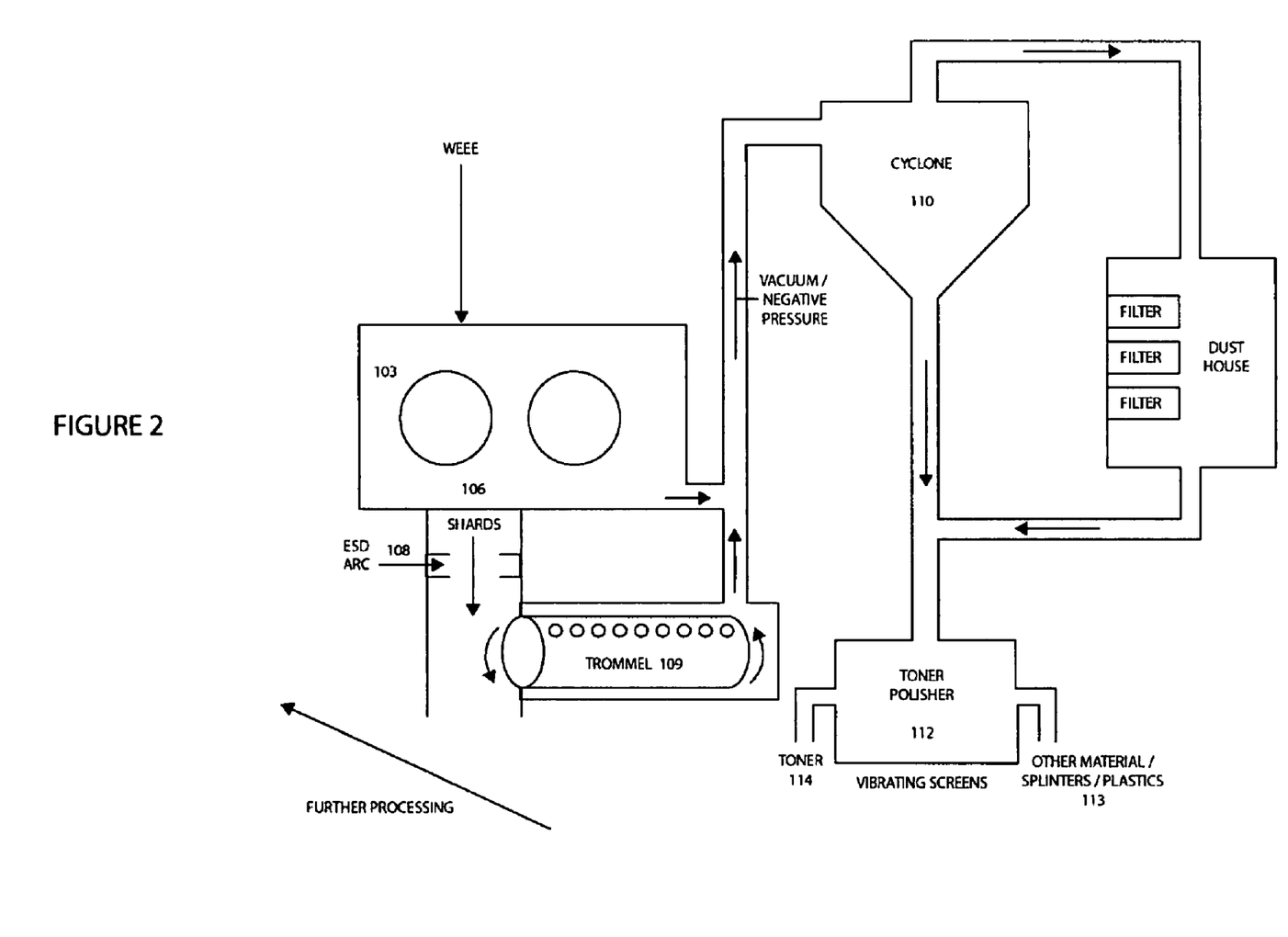
FIG. 2 illustrates some detail in respect of toner extraction in accordance with one embodiment of the present invention.

Referring to FIG. 2, the shredder 103 is designed to run at relatively low RPM, for example between 20 and 30 RPM, not sparking cutting elements, and DIP (Dust Ignition Proof) drive to avoid ignition of the toner and/or any other materials being shredded. The shredder reduces the WEEE stream to shards, for example 2 cm in width and 6 to 10 cm long.

Some vacuum or low pressure 104 is applied to the output of the shredder to extract the toner dust 105. This toner extraction 105 is conducted by a dust elutriation system.

FIG. 2 illustrates some more detail of the toner extraction step 104. The shards 106 are exposed to vacuum 107, are then further exposed to an electro-static dissipation device 108 and are then feed to a trommel 109. It has been realised that the toner powder and toner dust electrostatically clings to the plastics material. For this reason, the electrostatic dissipation device 108 is used to free at least some of the toner from the plastics material. The trommel 109 mechanically further separates the adherent toner dust from the shredded material. The residual shredded material is then passed to the next stage of the WEEE 'dry' processing. At each stage of the processing of FIG. 2, preferably, the toner is extracted by suitable means and collected. For example, the toner may be fed to a cyclone 110 to separate the toner from the residual airstream. The residual airstream has been found to include residual dust, and this is further filtered in a filter 111. Any material filter is feed back into the toner or recycling stream as will be detailed later herein.

The toner collected may be polished 112 to further separate remnant material 113 such as plastics from toner 114. The toner 114 may be processed as is described in co-pending PCT application PCT/AU2004/001709, the disclosure of which is incorporated herein by reference. Otherwise, the toner 114 and the other material 113 maybe recycled into the overall WEEE recycling process as will be described further herein. The toner 114 and other material 113 may also be mixed together in various proportions, as needed.

Returning to FIG. 1, the step after separation of toner 104, is that of metal separation 115. Metal separation occurs by magnetic and eddy current devices to remove ferrous and non-ferrous metals respectively. The magnetic separation is preferably conducted by a magnetic head in the form of a roller over which the shredded stream passes. The Magnetic head serves to separate ferrous metals. The remainder of the shredded material then passes an electro-magnetic drum separator, which removes further ferrous metal. The residual material is then passed through an eddy current drum to remove non-ferrous metals, such as aluminium, copper, brass, etc.

The mechanical shredding of WEEE, including toner cartridges and other WEEE produces a heterogenous mix of materials consisting of high-impact polystyrene, related styrenic polymers, ferrous metal, magnets, foil, polyolefins, sponge, non-ferrous metals (principally aluminium and copper), engineering plastics, ceramics, etc. Thus, following the step of substantial metal separation, there is a stream 116 which is substantially a mixture of plastics (in the majority) and other materials which formerly formed the WEEE. The stream 116 is then provided to a density separation process 117.

In accordance with an aspect of invention, a sequential float-sink separation (SFSS) process has been devised which consists of density baths containing aqueous ionic salt solutions. The density of the ionic salt baths are adjusted in order to give float-sink separation of different materials. The density is adjusted to a point between the densities of the components so that higher density components sink while lower density particles float. By using different ionic salts and varying their concentration virtually any materials with a density of 1.0-2.0 g/cm3 can be separated. The process is considered safe, economical, environmentally benign, effective and lends itself to scaling up and automation.

In this regard, the inventors have realised that the highly heterogeneous composition of toner cartridges and other WEEE waste and their lack of design for recycling makes it is difficult to implement fully automatic disassembly and separation processes for printers and printer consumables.

The commingled and complex nature of WEEE, namely intimate mixtures of plastics, metals, ceramics and toner dust, makes the recovery of useful material streams from toner and inkjet cartridges extremely challenging. Electronic plastics streams can be very complex since multiple plastics types are used and multiple grades of each plastic exist.

The inventors further realised that most plastics are mutually incompatible with each other and that if incompatible plastics are melt blended (by extrusion) then, on cooling, the mixture phase separates and the resultant products usually have low mechanical properties since cracks develop through the plane of weakness between the immiscible phase. In accordance with the present invention, the additive material and the various processes described address this problem.

It has been found in accordance with an aspect of invention, that upon initial inspection, the plastic stream from shredded toner and inkjet cartridges contain three distinct families of plastics. These are:
Styrenics (medium density)
Polyolefins (low density), and
Engineering plastics and non-ferrous metals (high density)

Styrenic plastics are largely used for the structural components such as the housings, cover flaps and body components. Styrenic plastics include, without limitation, general-purpose polystyrene, high-impact polystyrene (HIPS), acrylonitrile-butadiene-styrene (ABS), heat resistant ABS, ABS/polycarbonate (ABS/PC) blend, flame-retardant PS, flame-retardant ABS and styrene-acrylonitrile (SAN).

Polyolefins are plastics such as low-density polyethylene, high-density polyethylene, medium-density polyethylene, polypropylene, ethylene-vinyl acetate copolymers, etc. Polyolefins are used in non-load-bearing parts such as toner bottles, covers, small mechanical parts, clips.

Engineering plastics are plastics such as nylon (polyamides), polycarbonate, polyesters (polybutylene terephthalate, polyethylene terephthalate), polyacetal, heavily brominated plastics, etc. Nylons as a family has many members such as nylon 6, nylon 6/6, nylon 6/12, nylon 11, nylon 12. Engineering plastics are typically used for parts such as gears, cogs, worm screws, shafts, drive mechanisms, and fasteners.

Although the toner cartridges contain multiple plastic types it is possible to separate these plastics into various groups within which the plastics are largely compatible. For instance, it has been realised that within the family of styrenic polymers there exist sufficient compatibility to enable blending of these polymers to produce a useable blend.

Separation of mixed plastics can be accomplished by a variety of techniques including infra-red, x-ray, density-based, electrostatic, etc. Of these the density-based methods are considered most attractive because of their simplicity. In order to maximize separation rate throughput, however, centrifugal and hydrocyclonic systems may be used.

The technique as disclosed herein may be used, although it is not essential to the invention of recycling WEEE. The technique, however, may be applied equally to other plastics material separation for any WEEE component materials. The description below details the specific gravities (grouped into relative 'ranges') of various plastics used in the construction of toner, inkjet and printer cartridges, for example:

| Plastic | Specific Gravity |
| --- | --- |
| Polypropylene | 0.89-0.91 |
| Ethylene vinyl acetate (EVA) | 0.93 |
| Polyethylene (low density) | 0.91-0.925 |
| Polyethylene (high density) | 0.94-0.96 |
| Polystyrene (general purpose) | 1.04-1.09 |
| Polystyrene (high impact) | 1.04-1.10 |
| ABS | 1.04-1.07 |
| SAN | 1.07-1.10 |
| PC/ABS | 1.09-1.12 |
| Nylon 6 (unfilled) | 1.14 |
| Nylon 6,6 (unfilled) | 1.15 |
| Acrylics | 1.17-1.20 |
| Polycarbonate | 1.20 |
| Polyethylene terephthalate | 1.30 |
| PVC (flexible) | 1.30 |
| Nylon 6 (glass filled) | 1.37 |
| Polyacetal | 1.41 |

As can be seen from the above, a good level of variation exists between the styrenic polymers as a whole (density range 1.04-1.12 g/cc) and other polymer types. With this in mind, the inventors have realised that density-based separation lends itself well to the separation of these plastic types and that float-sink separation methods may be used as a technique of separation of WEEE based materials.

Referring again to FIG. 1, the waste plastic mixture 116 is first subject to an initial separation 117, preferably by adding the mixture 116 to a first tank containing substantially water in order to float off any medium density material 146 and/or polyolefins. The medium density material 146, such as styrenic polymers can then be recovered, preferably dried and because they are considered still relatively heavily contaminated to have any reuse or resale value, they are preferably reprocessed as a feedstock 124 for eWood. However, they may also be sold 125

The 'heavies', being mainly a commingled mix of plastics and non-ferrous metals 118 are then recovered and subjected to another float process 119, preferably by being added to a second tank which contains a substantially magnesium sulphate solution (density=1.125 g/cm3).

Depending on the desired separation, the solutions in the tank(s) may be varied. One or more tanks may have salt or other solutions.

In one embodiment, the density of a solution of magnesium sulphate heptahydrate (MgSO4.7H2O) may be varied from 0.01-1.25 g/cm3 as the concentration is varied from 1-30 g/100 g of water.

In another embodiment, the density of calcium nitrate (CaNO3) solution may be adjusted from 1.2-1.5 g/cm3 by varying the concentration from 5-38 g/100 g of water.

Still further, the density of a sucrose solution may be varied from 1.1-1.3 g/cm3 as the concentration is varied from 1 to 60 g/100 g of water.

Again, other alkali metal salts that may be used to achieve density solution in the density range 0.01-1.4 are sodium nitrate (1.1-1.3 g/cm3) and sodium bromide (1.1-1.4 g/cm3).

For relatively high density solutions, preferred salts based on cesium, for example, cesium bromide (working range: 1.05-1.5 g/cm3), cesium sulphate (working range: 1.15-1.8 g/cm3) and caesium chloride (working range: 1.0-1.9 g/cm3) may be used.

A small amount of detergent may be added to the float-sink tanks 117 and 119 in order to act as a wetting agent. This has been found to break the surface tension of the water and assist with wetting out of the plastic fragments and displaces adherent air bubbles. Agitation may also enhance removal of air bubbles that may keep plastic fragments afloat.

In the second float 119, the non-ferrous metals 121 are separated from the engineering or high density plastics 120, such as nylons, polyesters, polycarbonate and polyacetal. Also metal contamination has been found to sink. Technical grade magnesium sulphate may be used to make the density solution. The exact density was measured using calibrated hydrometers.

It has been found that by using simple density solutions, float-sink separation of mixed plastic from WEEE, such as shredded toner cartridges can be achieved to yield a stream of relatively pure styrenic polymers. Some critical contaminants that are removed by this process have been found to be aluminium, steel, nylon, polyesters and polyolefins. This enrichment of the streams 120 and 146 enables them to be used for the production of recycled plastic components 122 and 124 respectively, and/or be sold for the purpose of reuse or recycling by other manufactures 123 and 125 respectively.

Advantageously, this aspect of invention uses a plurality of tanks containing solutions of different specific gravities for continuously separating and recovering plastics from commingled material streams of recycled products.

Again, referring to FIG. 1, the material passing to the 'wet process' 102 is first shredded 126, and the shards 127 are centrifuged 128 in order to separate the liquids 129, such as ink, from the remaining solids 130. The solids 130 are then exposed to a metal separation step 131, similar to step 115. The remaining stream 132, which is substantially dry, undergoes air elutriation 133 in which a stream of counter-current air is used to separate relatively high density material 134 and relatively low density material 135, such as polyurethane foam. In operation, the counter-current air serves to draw the relatively low density material away by virtue of the air stream velocity.

In regard to the 'wet process', reference is made to co-pending PCT application PCT/AU2004/000134, the disclosure of which is incorporated herein by reference.

One important aspect of the present invention is the substantial re-use or recycling of all components of WEEE materials. In order to facilitate this, the inventors have developed a way of reprocessing some or all of the WEEE component materials which would otherwise be sent to landfill.

In one embodiment, the separation of WEEE constituent materials may be recycled into relatively high value applications or processes. For example, the WEEE constituent materials may be recycled or processed as follows:
  Toner—may be used as a colouring or pigmentation agent for plastics,
  PU (Polyurethane) foam—may be cleaned and rebonded for slab-stock foam, for example used as carpet underlay or furniture applications,
  PS plastics (polystyrene)—may be used in injection moulding processes and/or for example recycled into inkjet printer housings,
  Glass filled PET—may be used in injection moulding processes and/or for example recycled into inkjet printer components and office chairs bases,
  PP plastics (polypropylene)—may be used in blow moulding for form new plastics items
  Ink—which includes pigment based ink and dye based ink (which are mutually incompatible) and may be used, for example in printing, such as barcodes and/or cardboard box printing. If the pigment and dye based inks are mixed together, they form a sludge which may also be used in the process of obtaining de-dusted toner.
  Metals—this may be sold and/or smelted.

In another embodiment, the components are reprocessed into a form of lumber called 'eWood'. This 'eWood' process will now be described with reference to FIG. 1 in which the various WEEE component materials are densified, and then formed into the eWood product.

In FIG. 1, the steps in densification include, mixing 136 the toner 104 with some of the ink 129. The toner is preferably sprayed with the ink in order to form a 'de-dusted' toner 137. It has been found that the toner is liable to be liberated (unwantingly) unless it is processed into a relatively low-dusted form, such as by spraying with liquid ink. The toner 129 may alternatively be sprayed with other liquids, for example paraffin oil.

The de-dusted toner 137 is then blended 138 with other materials and/or other WEEE component materials, such as the low density material 135 (polyurethane foam) and is extruded 140 into an additive material and then crushed 141 into a powder-type substance, called additive material or masterbatch 142. This additive material may be sold and/or further processed for example as will be described below.

Other materials 134, 120, 122, 124, 135, 121, 129 and/or 105 may be added 139 at this stage, depending on the output required from the densification process, although it is not essential that this other material is added 139.

The additive material 142 may comprise at least two primary input materials, namely:
  Toner powder, preferably in the range of more than 0% up to 100%
  De-dusted toner, preferably in the range of more than 0% up to 100%, but more preferably substantially 33%
  Ink or Ink sludge, preferably in the range of more than 0% up to 30%
  Foam, such as polyurethane foam, preferably in the range of more than 0% up to 60%, but more preferably substantially 33%
  Plastics material, preferably in the range of more than 0% up to 100%, but more preferably substantially 33%.

The final composite product, such as eWood, may comprise:
  The additive material as disclosed herein, and may further comprise (but not necessarily comprise):
  Styrenics, preferably more than 50%
  various engineering plastics,
  various commodity plastics, such as PP, PE
  plastics containing flame retardants, such as BFR
  ABS/PC blend, such as mobile phone housings
  PC polycarbonate
  Glass
  Metal (ferrous and/or non-ferrous)
  PCB (printed circuit boards)
  Fibreglass
  Felt
  Silicone/silica
  Cardboard
  Glue
  Wire
  PVC
  Rubber
  Liquid crystal
  Any WEEE material which would have previously formed landfill.

Another aspect of the present invention is the provision of a substantially plastics material or product having more than 50% (or some other figure) styrenics, as well as the process of obtaining the material or product.

The additive (masterbatch) material is then fed to an extruder 143, together with other materials 134, 122 and/or 124 and optionally other material recovered from the WEEE and/or additional material or plastics sourced externally. The other material is preferably granulated prior to being fed to the extruder. The other material may, for example have a particle size of substantially 10 mm nominal. The proportions of materials fed to the extruder 143 are, approximately:

More than 80%, preferably 90% other materials, 134, 120, 121, 122, 124 or any one or a combination of those materials, and less than 20%, preferably 10% additive material 142

The additive blended with other material and/or contaminated plastics and by virtue of the reprocessing binds them into a relatively strong composite, which regains close to its original strength characteristics of the virgin resins, which it contains.

In one embodiment, there are benefits in adding the additive material, such as (toner/ink/PU foam) to produce eWood, namely:

- It is known that most plastics are mutually incompatible with each other. If incompatible plastics are melt blended (by extrusion) then on cooling the mixture phase separates and the resultant products usually have low mechanical properties since cracks develop through the plane of weakness between the immiscible phase.
- Advantageously the styrene-acrylate copolymer binder in black toner can act as a compatibilizer for the various polymer phases in eWood. The styrene acrylate copolymer acts as a compatibilizer by lowering interfacial surface tension between the different immiscible phases.
- The styrene-acrylate copolymer modifies the interfacial energy between the different polymer phases, achieves a finer and more homogeneous dispersion and the mechanical properties of the commingled blends are enhanced.
- The styrene-acrylate copolymer improves interfacial adhesion and importantly, reduce interfacial tension, thus allowing the formation of smaller phase domains.
- The styrene-acrylate copolymer is able to interact with the different polymer phases and promote adhesion between the phases. The optimally sized dispersed phases and strong interfacial bonding leads to eWood with better mechanical properties.
- Relatively consistent colouration
- UV stabilisation properties by virtue of the carbon black that exists in the toner.

Brominated flame retardants 144 are extracted in the extruding process, and which will be detailed further hereinafter and a resultant plastics material 145 may be shaped into any desired form, such as lumber.

Figure 3:
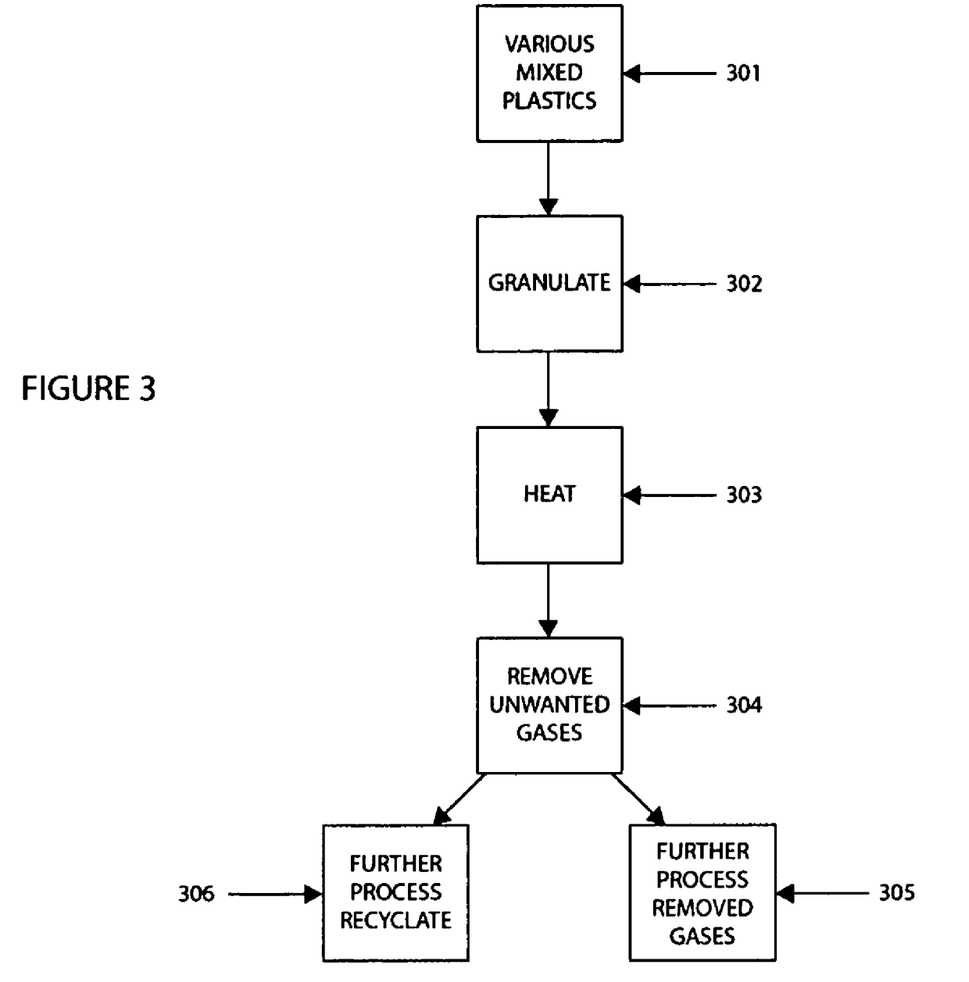
FIG. 3 illustrates one embodiment of the eWood process according to the present invention.

FIG. 3, which relates to the processing of the WEEE component materials subsequent to separation and densification steps as detailed above. One aspect that needs to be accommodated is the processing of the WEEE component materials with brominated flame retardants in mind, which vary considerably in both their volatility and thermal stability. Although some very stable compounds volatilize chemically unchanged, others break down within the polymer or react directly with it in the condensed phase. Hydrogen bromide is generally the major gaseous product.

A critical factor governing the effectiveness of brominated flame retardants and indeed their mechanism of action is their thermal stability relative to that of the polymers with which they are associated. The most favourable situation for a flame retardant to be effective will be one in which its decomposition temperature lies 50° C. or so below that of the polymer.

In general, decomposition at this temperature results in the liberation of substantial quantities of hydrogen bromide or elemental bromine. Owing to the relatively low C—Br bond energy, bromine compounds generally breakdown at quite low temperatures (typically 200-300° C.). The optimal processing temperature for debromination in the extruder is a temperature of 250-300 deg. C and preferably 265-270 deg. C. It has been found that relatively higher processing temperatures lead to what is considered to be excessive thermal degradation of the plastics leading to concomitant property deterioration while temperatures lower than 250 deg. C are considered to not induce sufficient decomposition of brominated flame retardants to gaseous bromine compounds.

The temperature thus preferred for decomposing brominated flame retardants whilst not decomposing common mixed polymers is therefore around 265-270 deg. C.

The equation relating to the brominated organics is:

equation 1

For many plastic waste streams, recycling may be difficult due to the presence of BFRs. For example, the use of recycled ABS (acrylonitrile-butadiene-styrene) as a blend with PC (polycarbonate), is not usually possible because the BFR causes the PC to depolymerise, resulting in poor quality of the recyclate. By the use of an aspect of the present invention, in which the melt is debrominated before blending, the recycled plastic with polycarbonate, the physical properties of the blend can be advantageously maintained.

The plastics containing brominated flame retardants are generally based on styrenics (e.g. PS, HIPS, ABS, PPO/PS, PPE/PS, ABS/PC) and polyamides (Nylon 6, nylon 6,6, nylon 12) and other engineering plastics such as polyacetal, polycarbonate, PET, PBT, liquid crystal polymers.

Referring to FIG. 3, the various mixed plastics waste materials 301 are first granulated 302 to average 9 mm flake. The flake is fed into an extruder hopper and heated 303 in the extruder to a temperature of 250-300 deg. C and preferably 265-270 deg. C. At this temperature, the brominated flame retardants have been found to begin to decompose and to give gaseous hydrobromic acid (HBr) and organobromine compounds.

In a prior art extruder, these gases would exit the extruder together with the melt (or extrudate) and there would be a high degree of foaming and porosity of the melt leading to a reduction in mechanical properties of the resultant moulding. For many plastic waste streams, recycling routes may be blocked due to the presence of Brominated Flame Retardants. For example, the use of recycled ABS (acrylonitrile-butadiene-styrene) as a blend with PC (polycarbonate) is not possible because the Brominated Flame Retardant causes the PC to depolymerise, resulting in poor quality of the recyclate. By debrominating the melt before blending the recycled plastic with polycarbonate the physical properties of the blend can be advantageously maintained. Moreover, these fumes would constitute an occupational and safety hazard for workers in the vicinity of the extrusion operation.

As noted below, and with reference to FIG. 4, an extruder is fitted with a screw that has a decompression zone or zones coinciding with the vent port or ports along the extruder barrel. At these zones the volatile HBr gas, and any other unwanted gases, will be extracted 304 by the vacuum or low pressure created by the vacuum pump or other suitable means. The gaseous decomposition products can be further processed 305, such as by being drawn through a water reservoir and the HBr and other brominated by-products will be scrubbed and neutralized.

The resulting extrudate relatively free of entrapped gases and porosity can then be further processed 306, such as by being moulded to form large rectangular retaining wall blocks or eWood lumber being sheets of WEEE recycled material being substantially 6 inches wide and 1 inch thick. The processing 306 may be used to mould or otherwise form the extruded material into any shape as may be required.

The eWood material as formed by the process as disclosed herein has a number of unique properties, namely:

- E-wood is a new, environmentally-responsible wood substitute which may be used as a replacement material in building, fabrication and furniture production,
- Dark hardwoods are commonly used in wood sculpture and furniture making. Many rare hardwoods are imported from tropical countries. In recent years, there has been considerable controversy in the woodworking community about the ethics of using rare tropical hardwoods in sculpture because the market for them is contributing to deforestation of many parts of the world. E-wood provides a sustainable alternative to natural hardwoods and also minimizes the quantities of plastics from electronics scrap that are sent to landfill,
- E-wood which is made from recycled WEEE materials, such as polystyrene and related styrenic plastics has almost the same characteristics as natural hardwood in terms of both look and feel, as well as density and structural features,
- The performance properties of eWood are in many ways superior to commercial hardwoods,
- The appearance of e-wood is similar to black walnut and ebony,
- E-wood has comparable screw and nail retention to natural wood and is flame and UV-retarded to suit external applications,
- E-wood is predominantly made from recycled WEEE, such as polystyrene and related styrenic plastics and in this regard has superior rigidity and dimensional stability compared with other types of plastic lumber which are made from mixed polyolefins (e.g. polyethylene and polypropylene),
- There is minimal dimensional change with e-wood with increasing temperature with the softening point being about 96 deg. C.,
- Since e-wood is pigmented throughout using carbon black (stemming from at least partially the de-dusted toner) there is little deterioration in surface appearance over time, unlike painted wood where the paint can flake and peel,
- E-wood substantially does not absorb moisture therefore it will substantially not rot, warp or crack. Consequently these is little risk of damage to an E-wood structure from warping, rot, or insects,
- E-wood requires little, if any, no water-proofing, staining or similar maintenance when used in many exterior applications,
- E-wood may be fabricated so that it has substantially no grain structure and hence no plane of weakness—therefore it will not split or chip,
- E-wood is relatively resistant to moisture absorption, bacteria growth and barnacle growth,
- While E-wood may develop a weathered appearance after many years outdoors since it is pigmented throughout a 'new' aesthetic finish can be generated simply by wiping the surface with a rejuvenation product such as Armourall.

If moulded into blocks, their large cross-sectional area provides a relatively high degree of strength and robustness despite their mixed plastic composition.

Figure 4:
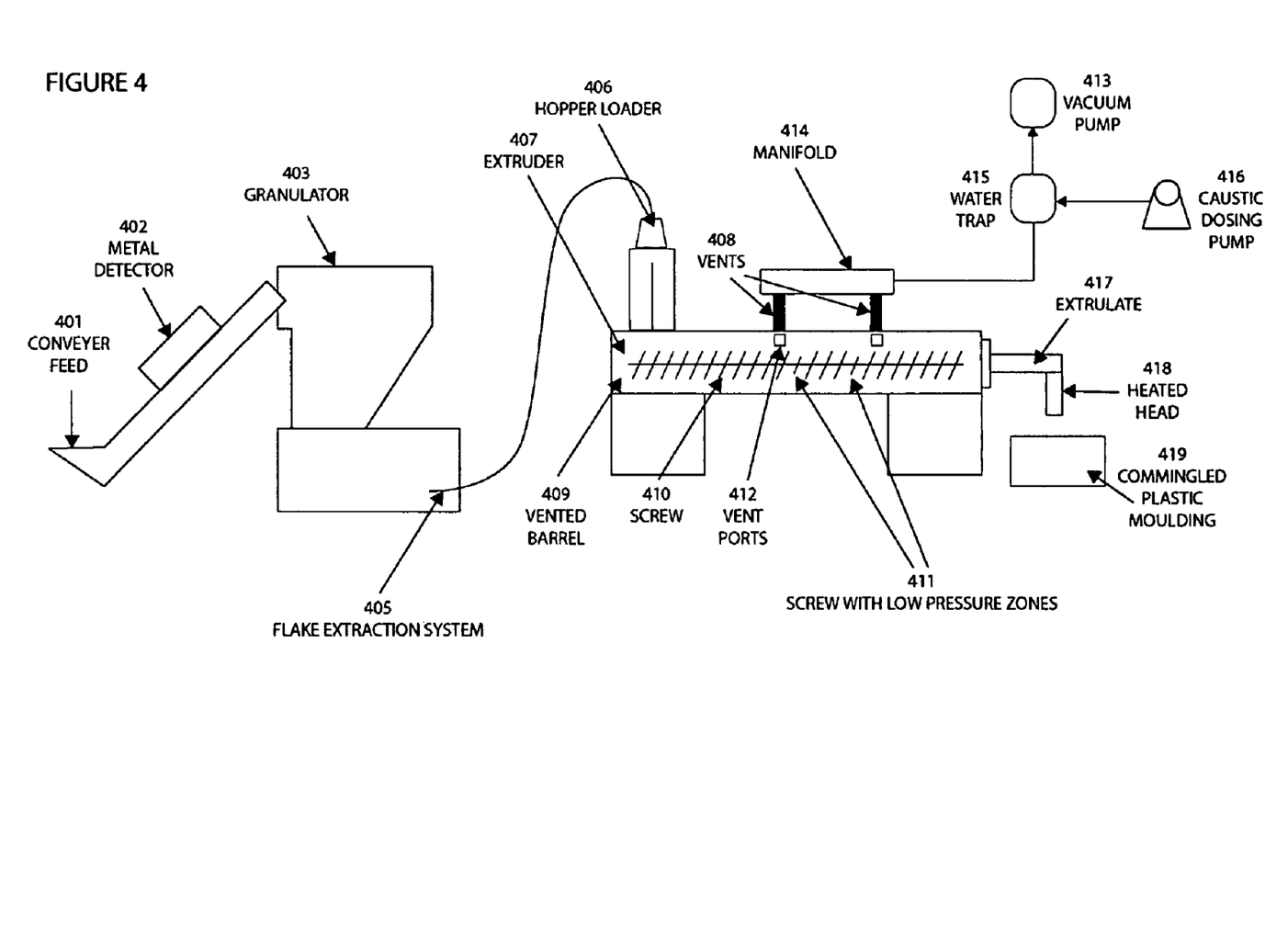
FIG. 4 illustrates one embodiment of apparatus used in association with the present invention, including a vented barrel according to an aspect of invention.

FIG. 4 illustrates one embodiment of apparatus adapted to be associated with the present invention. As noted above, the present invention provides a method for debrominating polymeric materials containing volatile components such as hydrobromic acid using an extruder with a vented barrel to enable devolatilization of the polymer melt. An aspect of invention, in part, relies on a vented barrel (i.e. one fitted with vent ports) to permit vacuum devolatilization without foaming of the melt extrudate and without liberation of potentially toxic fumes into the workplace.

It has been found to be advantageous to apply a vacuum to the polymer melt through at least one vent port in the extruder to remove volatile components in the composition.

The waste material is placed onto a feed conveyor 401, and is scanned of foreign objects at detector 402, such as metal. A granulator 403 turns the waste material into flakes 404. An extraction system 405 moves the flakes to a hopper loader 406, which in turn feeds the flakes 404 to the extruder 407. An additive material as herein described is blended with the flakes at a selected proportion prior to being fed to the extruder.

The extruder 407 is provided with one or more vent ports 408 along the barrel 409, also known as a vented extruder. The extruder is fitted with a screw 410 that has a decompression zone or zones 411 proximate or operatively coinciding with the vent port or ports 412 along the extruder barrel. At these zones 411 the volatile hydrobromic acid (HBr) gas will be extracted by the vacuum created by the vacuum pump 413. The vent port's 412 are connected via a manifold 414 to a vacuum pump 413, either a liquid-ring pump, water venturi pump, a root pump, a rotary vane pump, a diffusion pump or other suitable means as would be known in the art. A liquid ring vacuum pump is preferred. The embodiment also shows a water trap 415 and dosing pump 416 associated with the vacuum pump 413. A vacuum of at least 0.1 mbar is required to effectively exhaust the gaseous compounds from the extruder. The working fluid 415 in the vacuum pump (i.e. water) can be dosed, via pump 416 with an alkali (e.g. sodium hydroxide) to neutralize the acidic bromine compounds extracted from the vented extruder.

As noted above, the resulting extrudate 417 is relatively free of entrapped gases and porosity and can then be passed through a heated head 418 before being moulded (to any desired shape and/or size) in suitable mould, such as an open mould 419.

In one embodiment, the extruder barrel can be viewed as consisting of 6 separate zones. As the material flows through zone 1, the polymer begins to melt and is then partially devolatilized in zone 2. In zone, 3, the polymer is plasticized and undergoes further intensive mixing and shearing. Between zones 3 and 4, the volatiles extracted from the polymer are vented from barrel at zone 4. In zone 5, more blending and mixing of the polymer is accomplished and at zone 6 the homogenized polymer melt is extruded or suitable for extrusion through an orifice.

The extruder may be any extruder adapted to debrominate the polymer melt by extrusion devolatilization such as a single screw reciprocating extruder; a single screw non-reciprocating extruder, a co-rotating, intermeshing double screw extruder or a counter-rotating, non-intermeshing double screw extruder. The extruder typically comprises a single barrel, the extruder typically has a length to diameter ratio (UD ratio) of between about 20 and about 60.

A vacuum vent downstream of the primary mixing section of the extruder is referred to as "the first vacuum vent" and is characterized by the fact that all of the screw flight present in the extruder between the point of introduction of the solid polymeric material at the feed throat and said first vacuum vent are "right handed" (forward flighted) screw flights. At the first vent port, the screw flights are less pitched and shallower causing a low pressure zone. The first vacuum vent is preferably operated at a pressure between about 1 and about 750 torr, and still more preferably in a range between about 1 and about 500 torr and most preferably less than 100 torr.

Generally, it is preferable that the extruder be operated in a manner such that a substantial portion of the volatile bromine components present in the starting polymeric material are removed through the first vacuum vent. The amount of the volatile components being removed at the first vacuum vent may be regulated by controlling the feed rate of the solid polymeric material, the screw design, extruder operating parameters such as screw speed and temperature, and the pressure at which the vacuum vents are operated.

The extruder is preferably equipped with a second vacuum vent located downstream of the plasticization section. The second vacuum vent serves to remove additional volatile brominated components not removed through the first vacuum vent. Typically the second vacuum vent is operated at a pressure lower than the pressure at which the first vacuum vent is operated. The pressure at which the second vacuum vent is operated is typically in a range between about 1 and about 500 torr, preferably between about 1 and about 250 torr and most less than 10 torr. The molten polymer present in the extruder between the first and second vacuum vents is referred to as the partially devolatilized polymer melt.

The extruder may also be equipped for multistage stripping agent injection (e.g. water) in order to facilitate the removal of persistent bromine volatile components that may present.

It is possible with the present invention to recover bromine from WEEE, as well as other waste materials, in a relatively economical and ecologically feasible way by the isolation of the bromine from the gas stream and in an example suitable form by absorption of the bromine into an aqueous (hydroxide) solution. The hydrogen bromide in the product gas may be neutralised and converted into salt. Under extrusion conditions, the one important bromine compound from WEEE is HBr with small amounts of Br2 and possibly organobromides. The recovery of this is accomplished either as HBr by adsorption in water (at pH=1) or by neutralisation with sodium or calcium hydroxide, forming NaBr or CaBr2 salt.

The process is only applicable only to BFR but other gases that can be extracted such as steam (so wet plastics can be processed), styrene monomer (from the decomposition of styrenic plastics), formaldehyde from the decomposition of polyacetal, bis-phenol A (from the decomposition of polycarbonate).

While this invention has been described in connection with specific embodiments thereof, it will be understood that it is capable of further modification(s). This application is intended to cover any variations uses or adaptations of the invention following in general, the principles of the invention and including such departures from the present disclosure as come within known or customary practice within the art to which the invention pertains and as may be applied to the essential features hereinbefore set forth.

As the present invention may be embodied in several forms without departing from the spirit of the essential characteristics of the invention, it should be understood that the above described embodiments are not to limit the present invention unless otherwise specified, but rather should be construed broadly within the spirit and scope of the invention as defined in the appended claims. Various modifications and equivalent arrangements are intended to be included within the spirit and scope of the invention and appended claims. Therefore, the specific embodiments are to be understood to be illustrative of the many ways in which the principles of the present invention may be practiced. In the following claims, means-plus-function clauses are intended to cover structures as performing the defined function and not only structural equivalents, but also equivalent structures. For example, although a nail and a screw may not be structural equivalents in that a nail employs a cylindrical surface to secure wooden parts together, whereas a screw employs a helical surface to secure wooden parts together, in the environment of fastening wooden parts, a nail and a screw are equivalent structures.

"Comprises/comprising" when used in this specification is taken to specify the presence of stated features, integers, steps or components but does not preclude the presence or addition of one or more other features, integers, steps, components or groups thereof."

The claims defining the invention are as follows:

1. A moulded composite plastics product comprising:
   at least 50% recycled styrenics,
   no more than 50% recycled polyolefins,
   polyamides, and
   toner in an amount greater than 0% and less than 20%.

2. A moulded composite plastics product as claimed in claim 1 wherein the toner is present in an amount greater than 0% up to a maximum of 10%.

3. A moulded composite plastics product as claimed in claim 1 wherein the styrenics comprise at least one of:
   ABS, in the range of more than 0% up to 90%,
   PC/ABS, in the range of more than 0% up to 90%
   PPO/PS, in the range of more than 0% up to 90%,
   PPE/PS, in the range of more than 0% up to 90%,
   HIPS, in the range of more than 0% up to 90%,
   PS, in the range of more than 0% up to 90%,
   PC, in the range of more than 0% up to 90%,
   Noryl, in the range of more than 0% up to 90%, and
   other styrenics, in the range of more than 0% up to 90%.

4. A moulded composite plastics product as claimed in claim 1 wherein the polyolefins comprise at least one of:
   PP, in the range of more than 0% up to 50%,
   HDDE, in the range of more than 0% up to 50%,
   LDPE, in the range of more than 0% up to 50%, and
   other polyolefins, in the range of more than 0% up to 50%.

5. A moulded composite plastics product as claimed in claim 1 wherein the polyamides comprise at least one of;
   nylon 6, in the range of more than 0% up to 90%,
   nylon 6,6, in the range of more than 0% up to 90%, and
   nylon 12, in the range of more than 0% up to 90%.

6. A moulded composite plastics product as claimed in claim 1 which is a moulded lumber replacement product.

7. A method for manufacturing a moulded composite plastics product as claimed in claim 1, the method comprising the steps of:
   (i) providing a stream of WEEE materials including imaging consumables that contain toner,
   (ii) shredding the WEEE materials of the stream, (iii) removing toner from the shredded stream of WEEE,
   (iv) mixing shredded de-tonered WEEE plastics materials from step (iii) to provide a mixture of WEEE plastics that includes at least 50% styrenics and no more than 50% polyolefins, (v) melt blending the plastics of the mixture of WEEE by passing the mixture through an extruder, (vi) adding a compatibilizing material, including toner, in an amount greater than 0% up to a maximum of less than 20% to the mixture of step (iv), or to the melt blend of step (v) whilst it is passing through the extruder to produce an extrudate, and (vii) moulding the extrudate of step (vi) to form the moulded composite plastics product.

8. A method for manufacturing a moulded composite plastics product as claimed in claim 7 wherein the compatibilizing material, including toner, is added in an amount greater than 0% up to a maximum of 10%.

9. A method for manufacturing a moulded composite plastics product as claimed in claim 7 wherein the step of removing toner (step iii) is followed by a step of removing metals from the shredded de-tonered WEEE materials.

10. A method for manufacturing a moulded composite plastics product as claimed in claim 9 wherein the step of removal of metals from the shredded de-tonered materials is followed by a step of separating the WEEE plastics into different types of plastics, including separating styrenics from polyolefins.

11. A method for manufacturing a moulded composite plastics product as claimed in claim 7 wherein during the passing of the mixture through an extruder to melt blend the plastics of the mixture of WEEE, the mixture is heated sufficiently to decompose Brominated Flame Retardants (BFR's) in the plastics to give off gaseous hydrobromic acid (HBr), and organobromine compounds.

12. A method for manufacturing a moulded composite plastics product as claimed in claim 11 wherein the gaseous hydrobromic acid and organobromine compounds are removed by applying a vacuum to vent ports along the extruder.

13. The moulded composite plastics product of claim 1, wherein the polyamides comprise nylon.

* * * * *